United States Patent [19]
Pierson et al.

[11] Patent Number: 5,875,011
[45] Date of Patent: Feb. 23, 1999

[54] LIQUID CRYSTAL DISPLAY TILE INTERCONNECTED TO A TILE CARRIER AND METHOD

[75] Inventors: Mark Vincent Pierson, Binghamton; Michael Anthony Gaynes, Vestal; David Brian Stone, Owego; Thurston Bryce Youngs, Endicott, all of N.Y.

[73] Assignee: International Business Machines Corporation, Armonk, N.Y.

[21] Appl. No.: 834,861

[22] Filed: Apr. 10, 1997

[51] Int. Cl.[6] .......... G02F 1/133; G02F 1/1345; G02F 1/1333
[52] U.S. Cl. .......... 349/73; 349/122; 349/149; 349/158
[58] Field of Search .......... 349/73, 149, 158, 349/122

[56] References Cited

U.S. PATENT DOCUMENTS

| | | | |
|---|---|---|---|
| 4,106,860 | 8/1978 | Kaufmann | 350/343 |
| 4,277,143 | 7/1981 | Pauli et al. | 350/334 |
| 4,443,062 | 4/1984 | Togashi et al. | 350/332 |
| 5,241,133 | 8/1993 | Mullen, III et al. | 174/52.4 |
| 5,539,550 | 7/1996 | Spitzer et al. | 349/73 |
| 5,661,531 | 8/1997 | Greene et al. | 349/73 |
| 5,777,705 | 7/1998 | Pierson et al. | 349/73 |
| 5,781,258 | 7/1998 | Dabral et al. | 349/73 |
| 5,796,452 | 8/1998 | Pierson | 349/73 |

Primary Examiner—William L. Sikes
Assistant Examiner—Toan Ton
Attorney, Agent, or Firm—Pollock, Vande Sande & Amernick; John R. Pivnichny

[57] ABSTRACT

A liquid crystal display is provided wherein a plurality of liquid crystal display tiles are arranged in a matrix and are electrically interconnected to a tile carrier by depositing an electrically conductive metal on a sidewall edge of the liquid crystal display such as by plating, evaporation, or sputtering. Also provided is the method for forming the liquid crystal display.

23 Claims, 3 Drawing Sheets

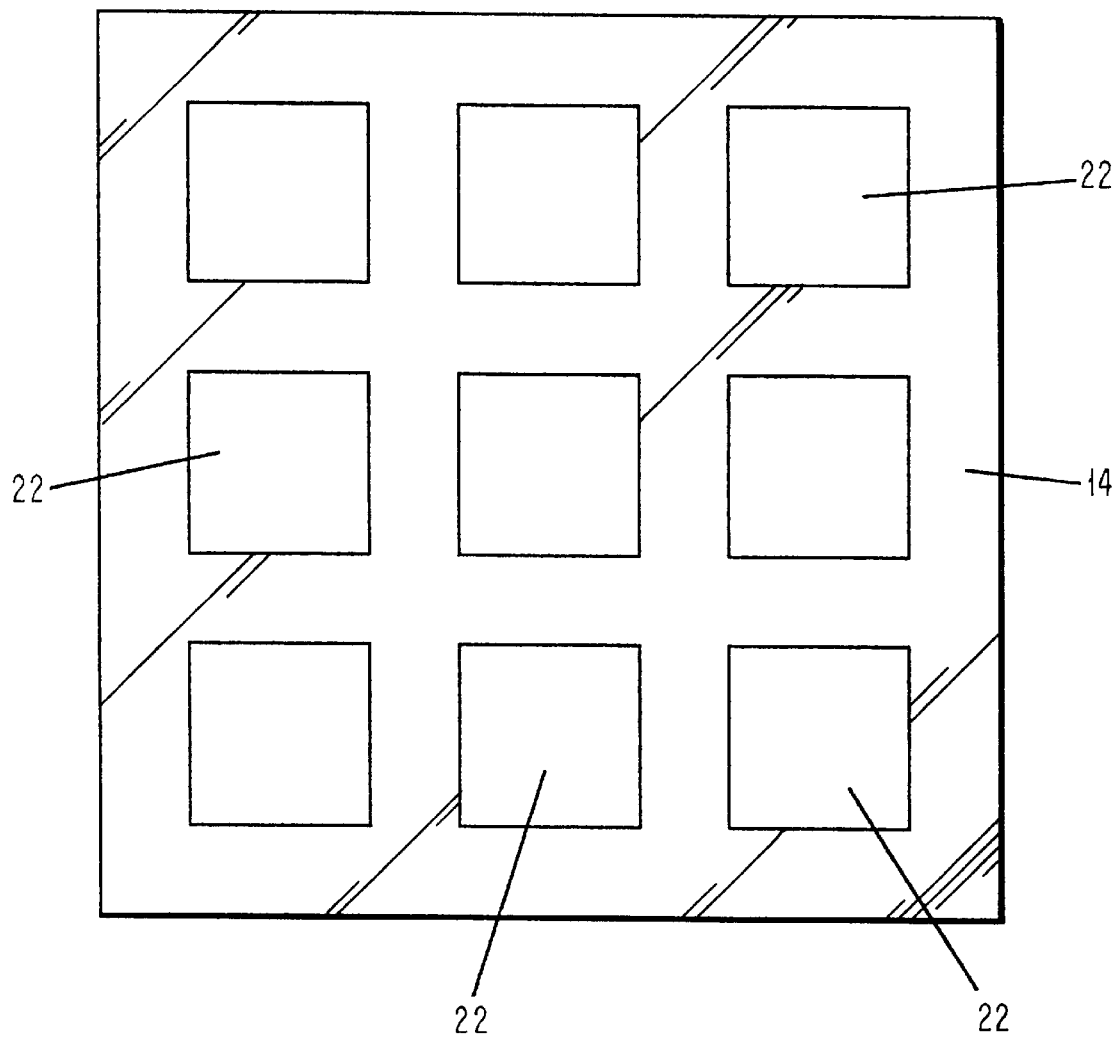

LIQUID CRYSTAL DISPLAY TILE INTERCONNECTED TO A TILE CARRIER AND METHOD

TECHNICAL FIELD

The present invention is concerned with a liquid crystal display and particularly concerned with the electrical interconnection between a plurality of liquid crystal display tiles arranged in a matrix to a tile carrier. The present invention is especially concerned with providing an interconnection between the liquid crystal display tiles and tile carrier which achieves tighter tile spacing. The present invention is also concerned with the method for forming the electrical interconnection between the liquid crystal display tile to the tile carrier.

The present invention is especially concerned with larger liquid crystal displays formed by tiling together smaller liquid crystal displays, and in particular, the electrical interconnections between the driver circuits, and the individual tiles.

BACKGROUND ART

Liquid crystal displays (LCDs) are used extensively as monitors for numerous computer applications. Generally, liquid crystal displays are an assembly comprising a glass panel unit (which is a thin film transistor matrix controlling a liquid crystal emulsion contained between glass plate electrodes); driver electronics which provide the control signals to the thin film transistor matrix, and a lighting unit placed beneath the glass panel unit for illuminating the liquid crystal display panel. The glass panel unit includes a transparent glass substrate upon which the thin film transistor matrix is placed (the LCD or panel substrate), a second conducting transparent glass plate placed a small distance from and parallel to the panel substrate, filled-in between with the liquid crystal material, and sealed around the edges. The second glass panel is also prepared as an electrode to establish a capacitive connection with the individual transistors in the thin film transistor matrix on the panel substrate. The entire assembly is housed by a frame and usually has the driver assemblies attached to the frame near the front surface of the panel substrate which contains the thin film transistor array. The liquid crystal material is subjected to electric fields set up between the transistors and the thin film transistor and the cover glass transparent electrode.

Increasing the size of LCDs is continuously being demanded by industry. One method used to fabricate larger displays is referred to as tiling. In tiling, conventional sized LCD tiles are arranged in a matrix. Typically, the driver chips are interconnected to the LCD either directly on the perimeter of the display or to flexible tape which is then interconnected to the edge of the LCD.

In the tiling method, edges of an individual LCD tile may be internal to the overall matrix edge. However, these internal edges must also be electrically connected to the driver chips. Currently, these interconnections are made by wire bonding, flex circuits or conductive adhesives. However, these methods pose serious limitations on the minimum spacing that can be achieved between individual tile elements in the matrix. The spacing between tiles represents a critical parameter that must be controlled in order to present a "seamless" look generated by the tiled LCD. More particularly, the dimension of the spacing between tiles should be less than the space between pixels in the LCD. One estimate for the tile-to-tile space is 380 microns. Of the 380 microns, only about 100 microns is available for passage of an interconnect from the tile edge to escaping or interconnecting circuitry of a tile carrier located below the tile.

However, employing flex circuits for this purpose requires a ledge of about 2000 to about 4000 microns. Likewise, employing conductive adhesive typically requires a ledge of at least about 2000 microns. Furthermore, conductive adhesives are limited in extendibility. Likewise, wire bonding presents a formable technical challenge because of the highly constrained workspace presented by a 100 micron ledge. Wire bonding is made even more difficult because two 180° loops are needed to interconnect the necessary surfaces that oppose each other.

Accordingly, the desire is to move tiles closer together as performance and resolution are continuously being improved while the electronics is becoming smaller. Therefore, improved techniques for electrically interconnecting the LCD tiles to the underlying tile carriers that require significantly reduced real estate would be desirable.

SUMMARY OF INVENTION

The present invention is concerned with providing electrical interconnection between a plurality of liquid crystal display tiles arranged in a matrix to its tile carrier that permits tighter spacing between individual tiles of the matrix. In particular, the present invention is concerned with a liquid crystal display comprising a plurality of liquid crystal display tiles arranged in a matrix and electrically interconnected to a tile carrier. Each tile is a sandwich of a top panel and a substantially parallel bottom panel, typically glass. A circuit path is located on the top major surface of the bottom panel or plate. This surface can be referred to as the lower interior surface of the tile or "TFT Layer." The side wall edge of the bottom panel of the liquid crystal display and the bottom surface of each of the tiles contains an electrically conductive metal thereon provided by evaporation, and/or sputtering to thereby provide the electrically interconnection between the liquid crystal circuit path on the lower interior surface of the tile and the bottom surface of each tile.

In addition, the present invention is directed to the method for fabricating the above disclosed liquid crystal display arrangement. More particularly, the method of the present invention is concerned with forming a liquid crystal display comprising a plurality of liquid crystal display tiles arranged in a matrix interconnected to a tile carrier. The process includes providing tiles having a sandwich arrangement of two panels, with each tile containing a circuit path located on its lower interior surface. Next, the process involves metallizing a side wall edge of the plate of the tiles of the liquid crystal display, and the bottom surface of each tile of the liquid crystal display by depositing an electrically conductive metal by evaporation, and/or sputtering to thereby electrically interconnect the liquid crystal circuit path on the top major surface of the bottom plate of each tile to the metallization located on the bottom surface of each tile. A plurality of the metallized tiles is arranged in a matrix on a tile carrier to thereby provide the liquid crystal display arrangement. The surface of the bottom panel of the tile carrier that contacts the bottom plate of the tile contains a circuit path for escape. This escape circuit path is in contact with metallization located on the bottom surface of the tiles.

Still other objects and advantages of the present invention will become readily apparent to those skilled in this art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF DRAWINGS

FIG. 4 is a top view of a liquid crystal display tile matrix.

BEST AND VARIOUS MODES FOR CARRYING OUT INVENTION

Figure 1:
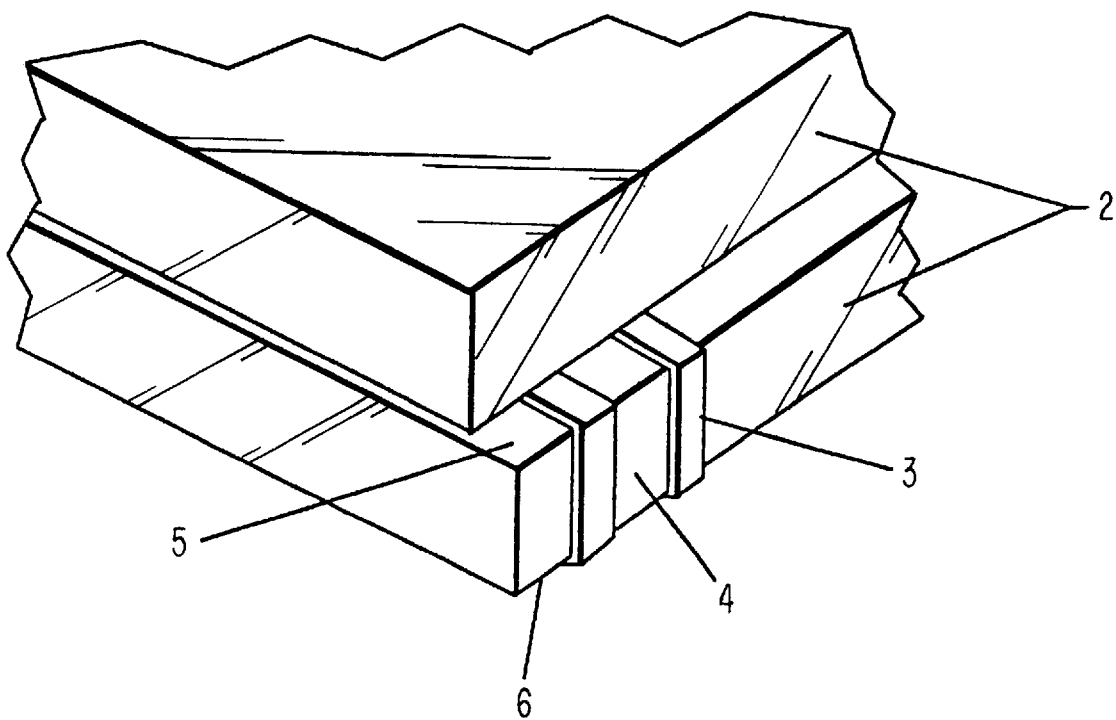
FIG. 1 is an isometric view of the interconnection provided on one of the liquid crystal display tiles according to the present invention.
Figure 2:
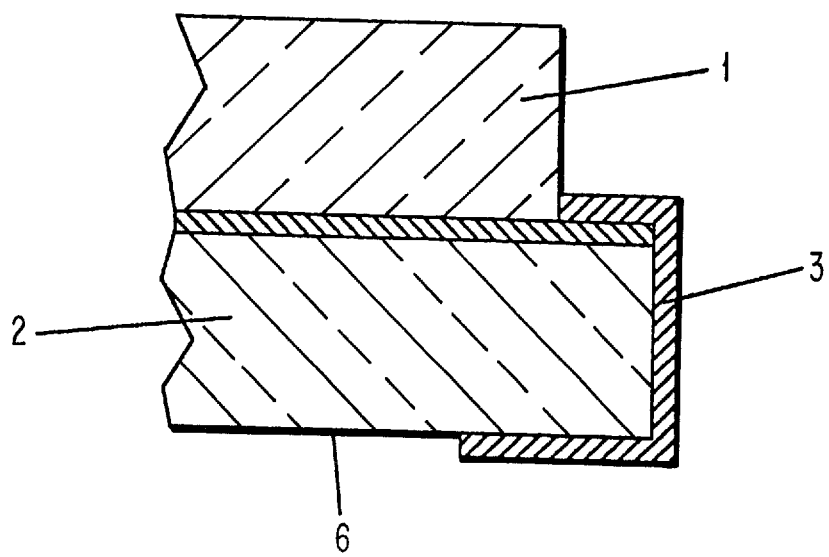
FIG. 2 is a section view of the interconnection of an individual liquid crystal display tile according to the present invention.
Figure 3:
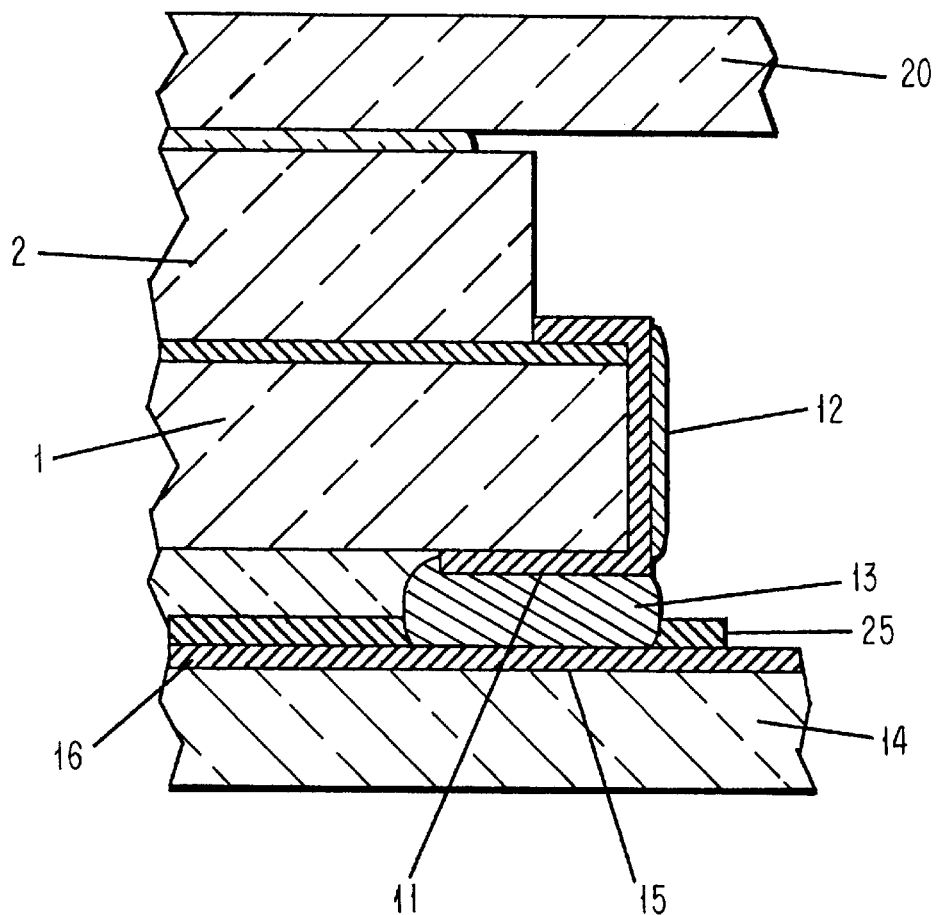
FIG. 3 is a schematic diagram of an individual display tile connected according to the present invention to a tile carrier.
Figure 5:
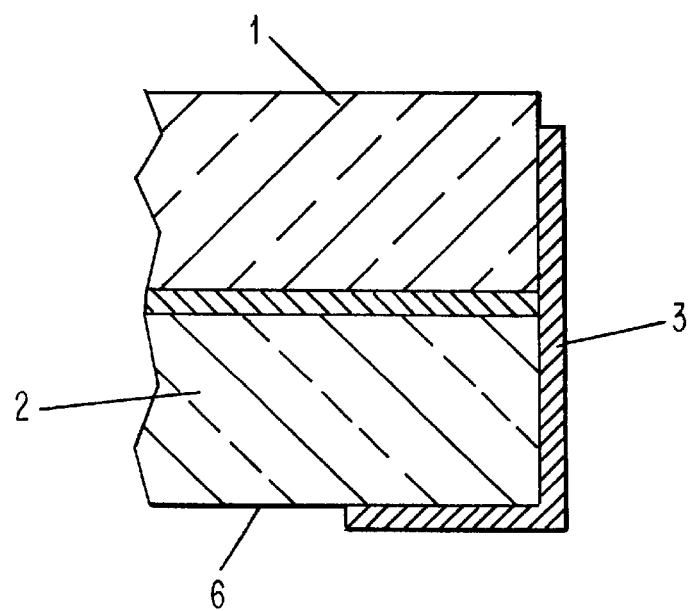
FIG. 5 is a section view of the interconnection of an individual liquid crystal display tile according to the present invention.

In order to facilitate an understanding of the present invention, reference will be made to the drawings, wherein the same numbers represent like elements in different figures. FIG. 1 is an isometric view of liquid crystal display tile. The liquid crystal display tile includes panels 1 and 2, which are typically glass. Metallization 3 is provided on the LCD ledge pad 5, its side edge 4 and the surface of the tile bottom 6. FIG. 3 illustrates bonding the LCD tile to the tile carrier 14, typically glass. The top cover plate of the tile carrier is designated as 20. In this embodiment, a second metal layer 12 is provided to facilitate solder connection 13 to tile carrier 14 on conductive pad 11 and the connected circuit path 16. Typically, the additional metal 12 is a thin layer about 80 to about 150 angstroms of chrome to prevent the solder from wicking up the line. This is significant since a plurality of tiles will be mounted on carrier 14 in very close proximity. Solder mask 25 located adjacent solder connection 13 prevents wicking of the solder and maintains it in place. For example, see FIG. 4 which illustrates the arrangement of the plurality of tiles 22 on the glass tile carrier 14. FIG. 5 illustrates an embodiment wherein the electrical interconnection employs tiles whereby there is no uncovered ledge pad on a major internal surface of the tile. In FIG. 5, metallization 3 is provided on a sidewall edge of the tile and the surface of the tile bottom 6.

Critical to the success of the present invention are the techniques that can be employed in providing the metallization. Typically, the electrical conductive metallization is copper. However, in order to achieve adequate adhesion between the copper and the inorganic substrate such as glass, a thin metal film such as chromium can be deposited as the first layer. The chromium, if desired, can be vapor deposited or sputtered to a thickness of less than about 500 angstroms, and more typically about 50 to about 250 angstroms, and preferably about 80 to about 150 angstroms. The chromium provides a tenacious bond to the underlying glass substrate while subsequently applied copper adheres well to the chromium. The metals would be provided on the edges of the LCD tile that requires electrical interconnection. If desired, all four edges could be metallized or fewer, such as only two of the edges, if desired. In addition, the entire area of the edges need not be coated with metal, but only that area which is sufficient to achieve the electrical communing for plating would need to be metallized. Those areas not to be coated by metal could be protected from coating by employing well-known masking techniques. Along these lines, when employing vapor deposition or sputtering, a tile assembly can be placed in a suitable enclosure having openings at the edges intended for the metallization. All other surfaces of the assembly would be shielded from the metallization by the enclosure.

Sputtering or evaporation of pure chromium can be used for depositing about a 300 to about 1000 angstroms thick film, which acts as an adhesion layer between glass and copper. Preferably evaporation is employed. Typical conditions include pressures of about $10^{-6}$ torr and temperature of about 100° C. Sputtering is typically carried out at pressures of about $10^{-3}$ torr.

After the seed copper layer is applied, a photoresist is applied and imaged by well-known photolithographical methods so as to reveal the interconnect pads on the top and bottom surfaces, and the edge adjoining these. The exposure of the photoresist can be carried out by conventional lighting schemes applied to all three surfaces (top, vertical edge and bottom). In the alternative, a laser can be used to perform the necessary exposure.

After exposure, the photoresist is developed exposing the areas that require copper to built up the circuit height needed for reliable electrical conduction. This is typically about 0.1 to about 37 microns, and preferably about 1 to about 12 microns. If desired copper plating can be followed by nickel and/or gold plating depending on requirements for the interconnection to the bottom of the tile carrier. The photoresist is then typically stripped and the copper layer etched to define the interconnect pattern. A second photoresist process can be used to protect the interconnect pattern during etching of the copper layer. In the alternative, if gold has been used, it would act as a protecting mask to the copper and chromium etchants used to remove the copper layer.

Sufficient circuit line height of the copper can be achieved employing conventional vapor deposition and sputtering techniques. Subsequent photolithography would then be used to personalize the interconnect pattern in conjunction with the etching. In addition, if desired, the interconnect pattern can be personalized by defining the masking in the vapor deposition or sputtering technique, thereby eliminating subsequent photolithography, plating and etching.

Sputtering and evaporation are both vacuum deposition processes. In evaporation, the source is heated in a vacuum to above its boiling or sublimation point. The metal deposits on the object to be metallized (and the rest of the vacuum chamber) in sputtering, the source of metal to be deposited, or target, is bombarded with ions such as to transfer enough energy to dislodge atoms from the target surface into the gaseous state. As with evaporation, the gas condenses on the object to be metallized. In depositing metal on glass, higher temperatures can improve adhesion of the chromium to the glass surface, but care must be taken to keep the LCD cool enough not to damage it. The preferred process is to deposit the chrome/copper/chrome metallurgy through a mask. The chrome may be selectively removable from the bond pads with laser radiation. This all dry process eliminates the risk of moisture damage to the LCD tiles.

Next, the individual tiles are arranged in a matrix and interconnected to the tile carrier by employing solder connected to conductive pads on the tile carrier. As mentioned above, it is desired to coat the copper with a final chrome layer, at least on the edges, so as to avoid wicking up of the solder. This is especially important because of the close proximity in which the individual tiles are arranged to each other according to the present invention.

The tile carrier serves the electrical function of carrying the row and column driver circuits to the individual tiles. As such, it requires two metal layers for designs of 3×3 tiles or greater. This requires the use of a transparent dielectric or preferably a photoimageable dielectric such as IBM's ASM, an epoxy based polymer system, that can be developed out of the pixel windows.

The circuits must be routed such that they do not interfere with the transmission of light through the pixels in the LCD's. Hence, the wiring must be fit into the dark spaces between pixels. A black matrix material may also be used on this layer to make the screen look uniform and help hide the tile-to-tile seems. A preferred material PSR4000 which can act as a solder mask and is opaque at reasonable thicknesses. It is an epoxy-based ink available from Taiyo Ink Manufacturing, Co.

The cover plate, like the back plate should contain a black matrix layer to define the pixels and hide the seams. It may also contain any various commercially available coatings to improve view angle and/or screen brightness, as known in the art.

Typical solders have melting points of about 120° C. or below such as a Sn 48 In 52 eutectic. The present invention is suitable for any number of tiles in a matrix typically greater than a 2×2 matrix since such would not require the type of bonding here, since all of the tiles would have external connection to the edge of the tile carrier.

In this disclosure, there are shown and described only the preferred embodiments of the invention, but, as aforementioned it is to be understood that the invention is capable of use in various other combinations and environments and is capable of changes or modifications within the scope of the inventive concept as expressed herein.

What is claimed is:

1. A liquid crystal display comprising a plurality of liquid crystal display tiles arranged in a matrix electrically interconnected to a tile carrier wherein each of the liquid crystal display tiles contains a top panel and a bottom panel arranged in sandwich form having a circuit path located on a top major surface of the bottom panel and a circuit path located on the bottom major surface of the tile and having an uncovered ledge pad portion on the top surface of the bottom panel; each of said liquid crystal displays tiles comprises metallization located on the ledge pad, at least one side wall edge of the bottom panel and the bottom surface of the tile to thereby electrically interconnect the liquid crystal circuit path on the top surface of the bottom panel of each tile to the metallization located on the bottom surface of each liquid crystal display tile, and electrically interconnect the plurality of liquid crystal display tiles arranged in a matrix to a tile carrier panel located beneath the bottom major surfaces of the plurality of liquid crystal display tiles.

2. The liquid crystal display of claim 1 wherein the electrical interconnection is copper having a thickness of about 50,000 angstroms to about 100,000 angstroms.

3. The liquid crystal display of claim 1 wherein the panels of said liquid crystal display tiles are glass.

4. The liquid crystal display of claim 1 which comprises a ledge pad located on the top major surface of said bottom plate and further comprises metallization on said ledge pad.

5. The liquid crystal display of claim 4 wherein said ledge pad of liquid crystal display tiles is about 180 microns.

6. The liquid crystal display of claim 1 wherein the liquid crystal display tiles are interconnected to said carrier by solder.

7. The liquid crystal display of claim 1 wherein the side wall edges contain electrically conductive copper coated with chrome.

8. The liquid crystal display of claim 1 wherein said tile carrier panel contains a circuit path on the major surface that contacts the bottom surface of said tiles.

9. The liquid crystal display of claim 1 wherein said display contains more than 2×2 tiles.

10. The liquid crystal display of claim 1 wherein the spacing between adjacent tiles is about 380 microns or less.

11. The liquid crystal display of claim 1 wherein the ledge pad on the tiles is about 100 microns or less.

12. The liquid crystal display of claim 1 wherein said metallization is provided by a depositing technique selected from the group consisting of evaporation, sputtering and combinations thereof.

13. The liquid crystal flat panel display of claim 1 wherein the top plate and bottom plate of each tile are dimensioned so as not to include a legal pad on an interior major surface.

14. A method for forming a liquid crystal display comprising a plurality of liquid crystal display tiles each containing a top panel and a bottom panel, said tiles being arranged in a matrix electrically interconnected to a tile carrier which comprises the steps of providing each of the tiles with a circuit path located on a major top surface of the bottom panel thereof;

metallizing at least one side wall edge of the bottom panel of each of the liquid crystal tiles and a portion of the bottom surface of each of the liquid crystal tiles by depositing an electrically conductive metal by a method selected from the group consisting of evaporation, sputtering and combinations thereof to thereby provide electrical interconnection between the liquid crystal circuit path on the top surface of the bottom panel and the bottom surface of each of the individual liquid crystal display tiles;

arranging the plurality of liquid crystal display tiles in a matrix placed on a tile carrier and then electrically interconnecting the individual liquid crystal display tiles to said tile carrier.

15. The method of claim 14 wherein the liquid crystal display tiles are connected to the tile carrier by solder.

16. The method of claim 14 wherein said electrically conductive metal is copper.

17. The liquid crystal display obtained by the method of claim 14.

18. The method of claim 14 wherein the copper is plated to a thickness of about 50,000 angstroms to about 100,000 angstroms.

19. The method of claim 14 wherein said plurality of liquid crystal display tiles are arranged in a matrix whereby the tile-to-tile spacing between adjacent tiles is about 380 microns or less.

20. The method of claim 14 wherein said tile carrier contains a circuit path on the major surface of the bottom panel that contacts the bottom surface of the tiles.

21. The method of claim 14 wherein the tiles include a ledge pad located on the top major surface of said bottom plate, and which comprises metallizing said ledge pad by a method selected from group consisting of evaporation sputtering and combinations thereof.

22. The method of claim 21 wherein the ledge pad on the tiles is about 100 microns or less.

23. The method of claim 14 wherein the top plate and bottom plate of each tile are dimensioned so as not to include a ledge pad on an interior major surfaced.

* * * * *

UNITED STATES PATENT AND TRADEMARK OFFICE
CERTIFICATE OF CORRECTION

PATENT NO. : 5,875,011
DATED : February 23, 1999
INVENTOR(S) : Pierson et al

It is certified that error appears in the above-identified patent and that said Letters Patent is hereby corrected as shown below:

Title Page, [75] Inventors, the last inventor's name is
---Thurston Bryce Youngs, Jr.---.

Signed and Sealed this

Fifteenth Day of June, 1999

Attest:

Q. TODD DICKINSON

*Attesting Officer*   *Acting Commissioner of Patents and Trademarks*